United States Patent
Balogh et al.

(10) Patent No.: US 9,573,221 B2
(45) Date of Patent: Feb. 21, 2017

(54) ELIMINATION OF TOOL ADHESION IN AN ULTRASONIC WELDING PROCESS

(71) Applicant: GM GLOBAL TECHNOLOGY OPERATIONS LLC, Detroit, MI (US)

(72) Inventors: Michael P. Balogh, Novi, MI (US); Wayne W. Cai, Troy, MI (US); Teresa J. Rinker, Royal Oak, MI (US); Thomas J. Chapaton, Sterling Heights, MI (US); Peng Lu, Troy, MI (US); Eric G. Hartnagle, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 14/739,256

(22) Filed: Jun. 15, 2015

(65) Prior Publication Data

US 2015/0375334 A1    Dec. 31, 2015

Related U.S. Application Data

(60) Provisional application No. 62/016,929, filed on Jun. 25, 2014.

(51) Int. Cl.
*B23K 1/06*    (2006.01)
*B23K 20/10*   (2006.01)
*B23K 3/02*    (2006.01)

(52) U.S. Cl.
CPC ............... *B23K 20/106* (2013.01); *B23K 1/06* (2013.01); *B23K 3/028* (2013.01)

(58) Field of Classification Search
None
See application file for complete search history.

(56) References Cited

U.S. PATENT DOCUMENTS

| 3,593,906 A * | 7/1971 | Hug ...................... B23K 20/005 |
| | | 156/73.1 |
| 6,527,027 B2 * | 3/2003 | Sugiura ............. H01L 21/67028 |
| | | 156/281 |
| 7,823,618 B2 * | 11/2010 | Masuda ................ H01L 21/563 |
| | | 156/281 |
| 2002/0121292 A1 * | 9/2002 | Betrabet ................. B29C 65/08 |
| | | 134/34 |

(Continued)

FOREIGN PATENT DOCUMENTS

CH    EP 1086777 A1 *    3/2001    ........... B23K 20/005
JP         55001114 A *    1/1980

*Primary Examiner* — Kiley Stoner
(74) *Attorney, Agent, or Firm* — Quinn Law Group, PLLC

(57) ABSTRACT

A welding assembly includes a sonotrode, cleaning station, and controller. The controller periodically commands clamping of the sonotrode onto the cleaning block, and a transmission of ultrasonic energy into the cleaning block for a calibrated duration sufficient for removing residual amounts of metal from welding pads of the sonotrode. The cleaning block may include an aluminum bar coated with a polymeric material, e.g., porous polyethylene silica or alumina composite. A thin sacrificial layer of an anti-adhesion material, e.g., colloidal silica, may be periodically applied to the welding pads, particularly after a transition from welding a first metal to welding a second metal. The sacrificial layer may be applied via a sponge, a saturated surface, or spraying.

19 Claims, 2 Drawing Sheets

(56) References Cited

U.S. PATENT DOCUMENTS

| | | | | |
|---|---|---|---|---|
| 2003/0066863 A1* | 4/2003 | Skogsmo | ............. | B23K 20/106 |
| | | | | 228/111.5 |
| 2004/0094254 A1* | 5/2004 | Lim | ........................ | B29C 65/08 |
| | | | | 156/73.1 |
| 2006/0289605 A1* | 12/2006 | Park | ..................... | B23K 20/004 |
| | | | | 228/4.5 |
| 2010/0006621 A1* | 1/2010 | Masuda | ................. | B23K 20/10 |
| | | | | 228/1.1 |
| 2010/0038406 A1* | 2/2010 | Masuda | ................. | H01L 24/75 |
| | | | | 228/102 |
| 2010/0224671 A1* | 9/2010 | Scheuerman | .......... | B23K 20/10 |
| | | | | 228/110.1 |
| 2011/0036897 A1* | 2/2011 | Nakai | ................ | H01L 21/67092 |
| | | | | 228/1.1 |
| 2011/0204031 A1* | 8/2011 | Kok | .......................... | B08B 5/02 |
| | | | | 219/74 |
| 2011/0272453 A1* | 11/2011 | Von Campe | ......... | B23K 1/0016 |
| | | | | 228/205 |
| 2013/0056025 A1* | 3/2013 | Widhalm | ................ | B29C 65/08 |
| | | | | 134/6 |
| 2013/0174965 A1* | 7/2013 | Yamamoto | ........ | A61F 13/15739 |
| | | | | 156/73.1 |
| 2013/0341377 A1* | 12/2013 | Cheng | ..................... | H01L 24/78 |
| | | | | 228/4.5 |
| 2014/0034712 A1* | 2/2014 | Maeda | .................... | H01L 24/78 |
| | | | | 228/160 |
| 2014/0138012 A1* | 5/2014 | Spicer | ....................... | B06B 3/00 |
| | | | | 156/64 |

* cited by examiner

ELIMINATION OF TOOL ADHESION IN AN ULTRASONIC WELDING PROCESS

CROSS-REFERENCE TO RELATED APPLICATIONS

This application claims priority to and the benefit of U.S. Provisional Application No. 62/016,929, which was filed on Jun. 25, 2014, and which is hereby incorporated by reference in its entirety.

TECHNICAL FIELD

The present disclosure relates to the elimination of tool adhesion in an ultrasonic welding process.

BACKGROUND

In ultrasonic welding processes, metal or plastic work pieces are clamped together between a welding horn/sonotrode and an anvil. Both of these welding tools include knurled welding pads that securely grip the clamped work pieces. Friction along interfacing surfaces of the work pieces in response to vibrational energy from the sonotrode ultimately generates substantial amounts of heat. The generated heat ultimately produces a weld spot or seam. Removal of the clamping force allows the welding pads to separate and release from the work pieces. However, at times the welding pads may adhere to surfaces of the work pieces. Depending on the severity of the adhesion, weld quality and process efficiency may be affected.

SUMMARY

A welding system is disclosed herein that provides two primary mechanisms for reducing surface adhesion, i.e., mechanical removal/elimination of surface residue on the welding tool, and the reduction/elimination of undesirable chemical reactions, such as between copper and aluminum, using colloidal silica or other suitable material. In a particular embodiment the welding system includes a welding horn or sonotrode having a plurality of welding pads. The welding system also includes a cleaning block and a controller in communication with the sonotrode. The controller is programmed to periodically command the sonotrode to clamp onto the cleaning block, and to transmit ultrasonic energy into the cleaning block for a calibrated duration sufficient for removing residual amounts of metal from a surface of the welding pads.

The controller may be programmed to count the number of welding cycles, and to periodically command clamping of the sonotrode onto the cleaning block after a calibrated number of such welding cycles.

In a possible embodiment, the cleaning block may include an aluminum or other metal bar and a polymeric surface material, for instance porous polyethylene silica or porous polyethylene alumina composite, which may be laminated onto the aluminum bar.

An optional application station may be used for applying a thin sacrificial layer of anti-adhesion material, e.g., colloidal silica, to the welding pads. In such an embodiment, the controller may be programmed to detect a transition from welding a metal work piece of a first metal to welding a metal work piece of a different second metal, with the second metal being different from and reactive with the first metal. One such example metal pairing is aluminum and copper.

The controller moves the sonotrode to the application station upon detection of the transition, and commands application of the anti-adhesion material to the welding pads as the sacrificial layer. Also, the controller commands movement of the sonotrode from the application station to the second metal work piece, and thereafter commands vibration of the sonotrode at a calibrated frequency for a duration that is sufficient for forming a weld on the work piece of the second metal.

The application station may include a sponge saturated with the anti-adhesion material. In such an embodiment, the controller maybe programmed to command application of the anti-adhesion material to the welding pads by commanding application of a force to the sonotrode sufficient for bringing the welding pads into direct contact with the saturated sponge.

In the alternative, the application station may include a spray nozzle in fluid communication with a fluid pump, in which case the controller commands application of the anti-adhesion material to the welding pads by commanding circulation of the anti-adhesion material to the spray nozzle via the fluid pump.

A method is also disclosed for reducing tool adhesion in an ultrasonic welding system having a sonotrode with a plurality of welding pads, a cleaning block, and a controller. The method includes determining, via the controller, a completion of a threshold number of welding cycles, and then clamping the sonotrode onto the cleaning block, via commands from the controller, in response to completion of the threshold number of welding cycles. The method includes transmitting ultrasonic energy from the clamped sonotrode into the cleaning block for a calibrated duration sufficient for removing residual amounts of a predetermined metal from the welding pads.

The above features and advantages and other features and advantages of the present disclosure are readily apparent from the following detailed description when taken in connection with the accompanying drawings.

DETAILED DESCRIPTION

Figure 1:
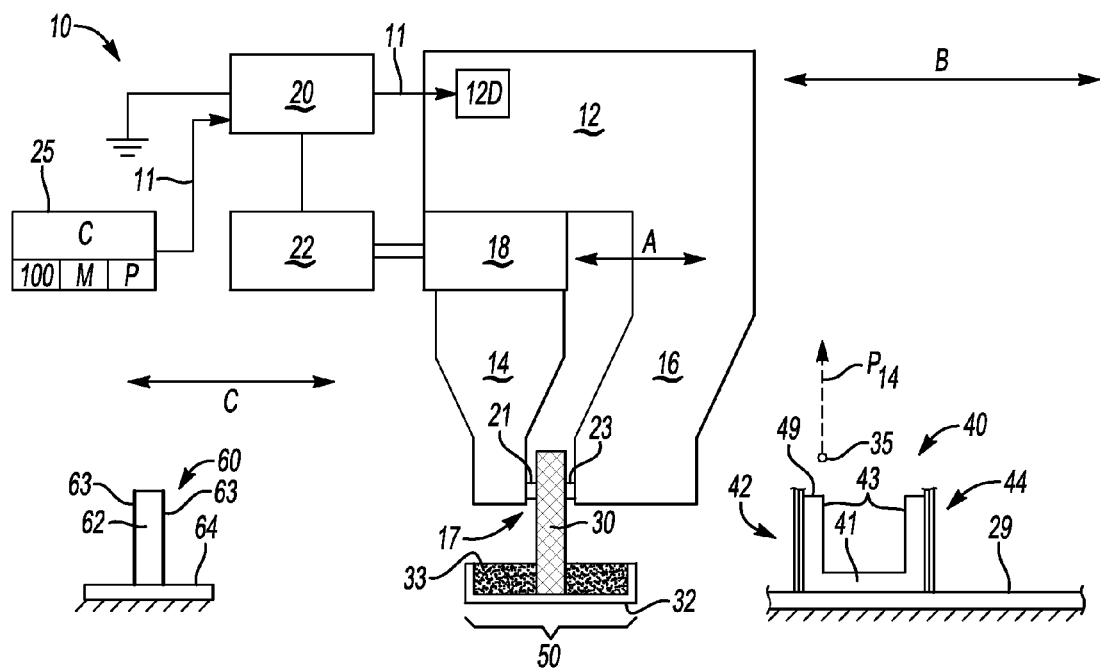
FIG. 1 is a schematic side view illustration of an example vibration welding system having a sonotrode with a sacrificial layer as set forth herein.

Referring to the drawings, wherein like reference numbers refer to like components, and beginning with FIG. 1, a welding system 10 is shown schematically in FIG. 1. The welding system 10 uses a welding assembly 12, i.e., welding tools in the form of a welding horn/sonotrode 14 and an anvil 16, to weld a set of work pieces 40 shown at lower right in FIG. 1. The work pieces 40 are depicted here and in FIG. 2 as a portion of an example battery module. However, other metal work pieces 40 may be welded via the welding system 10 without departing from the intended inventive scope.

The welding system 10 as described herein is used to ultrasonically weld the work pieces 40, to periodically clean knurled welding pads 21 and/or 23 of the respective sonotrode 14 and anvil 16, and optionally apply a thin sacrificial layer 17 to a surface of the welding pads 21 and/or 23 in-process so as to reduce or eliminate surface adhesion to the work pieces 40. Such surface adhesion can adversely affect the quality of the resultant weld, and/or can affect process efficiency, as noted above. For instance, when a knurled or textured welding pad 21 of the sonotrode 14 or a welding pad 23 of the anvil 16 adheres to the work pieces 40, an extra step is usually required to release the work piece 40. In some cases, extra force is applied to the sonotrode 14 or the work piece 40, which in turn can mar the appearance of the weld and/or deform the work piece 40. The present approach thus seeks to reduce or eliminate instances or severity of such tool adhesion. An example method 100 for welding the work piece 40 is described in detail below with reference to FIG. 3.

The welding system 10 shown in FIG. 1 may include a welding controller 20, which may be electrically connected to a 50-60 Hz wall socket or other suitable energy supply (not shown). The welding controller 20 may include, for example, voltage rectifiers, transformers, power inverters, and/or other hardware that collectively transforms the source power, whatever its form, into a suitable periodic signal. In ultrasonic welding, for instance, such periodic signals have a frequency of about 20-40 kHz, but this range may vary with the particular welding application.

The welding system 10 may also include a converter 22 having mechanical structure sufficient for producing a mechanical vibration of the sonotrode 14 in response to the control signals. The welding pads 21 each have a sufficient textured knurl pattern suitable for gripping and holding the work pieces 40 whenever the work pieces 40 are clamped together between the sonotrode 14 and the anvil 16 with a calibrated clamping force. The anvil 16 typically includes the welding pad 23 with a similar knurl pattern as the welding pad 21. A booster 18, i.e., an amplifier, is typically used to increase the amplitude of any commanded mechanical vibration from the welding controller 20 as needed.

The welding system 10 may also include a master controller (C) 25 in communication with the welding controller 20, or integrated with the welding controller 20. The master controller 25 may be embodied as a computer device having a processor P and memory M. Some of the memory M is tangible and non-transitory, e.g., optical or magnetic media. The memory M may also include random access memory (RAM) and electrically-erasable programmable read only memory (EEPROM). The controller 25 also includes a high-speed clock, analog-to-digital (A/D) and digital-to-analog (D/A) circuitry, input/output circuitry and devices, and signal conditioning and buffer circuitry. Any algorithms or computer-executable code resident in the controller 25 or accessible thereby, including any code or instructions necessary for implementing the method 100 of FIG. 3, can be stored in memory M and automatically executed by the processor P to ultrasonically weld the work pieces 40 as explained below. Also as explained below, a position sensor 35 may be used to measure a position of the sonotrode 14, with the measured position (arrow $P_{14}$) communicated to the controller 25 as a signal as part of the method 100.

It is posited herein that tool adhesion is largely rooted in the reactivity of residual metal materials on the welding pads 21. In an example copper-aluminum embodiment, for instance, coating of the welding pads 21 with the sacrificial layer 17 or cleaning the welding pads 21 prior to any welding of aluminum work pieces and immediately after welding copper work pieces can reduce adhesion. The approach may be extended to welding of other dissimilar material pairs, as will be readily appreciated by those having ordinary skill in the art. For illustrative consistency, copper and aluminum will be described hereinafter as example metals without limiting the welding system 10 of FIG. 1 to the welding of such metals.

The welding system 10 of FIG. 1 may include a cleaning station 60, shown schematically at left in FIG. 1, with the cleaning station 60 having a cleaning block 62 that is mounted or secured to a base 64. The cleaning block 62 may be constructed of, for example, a solid plate, bar, or block of aluminum, or a composite of aluminum, silicon polymers, silica, ceramic, glass fiber, metal wool, fabricated pads, sanding pads, carbon fiber, or the like in various embodiments. The material used as the cleaning block 62 should be sufficiently ductile so as not to abrade the welding pads 21, 23 while also remaining sufficiently resilient to damage from the sonotrode 14 and the anvil 16. The cleaning block 62 may be coated with a cleaning layer 63. For instance, the cleaning layer 63 may be applied, attached, or laminated to the cleaning block 62 to form a cleaning pad that facilitates the cleaning action. For instance, a polymeric material such as porous polyethylene silica or porous polyethylene alumina may be laminated as the cleaning layer 63 directly onto an aluminum bar in an example embodiment. Contaminants, metal residue, or dirt on the welding pads 21 and/or 23 are thus trapped in the cleaning layer 63, which in turn reduces adhesion.

The master controller 25 of FIG. 1 may be programmed to periodically command movement of the sonotrode 14 to the cleaning block 62 via the control signals (arrow 11), and to command a transmission of ultrasonic energy from the sonotrode 14 into the cleaning block 62 to thereby remove residual amounts of metal from the welding pads 21. The controller 25 may count the number of welding cycles and periodically, such as once every calibrated number of welding cycles, command movement of the welding assembly 12 to the cleaning station 60 as indicated by double-headed arrow C. The controller 25 can then command the sonotrode 14 and anvil 16 to clamp onto the cleaning block 62 as indicated by double-headed arrow A.

To accomplish such movement, the welding assembly 12 may be equipped with a linear and/or rotary actuator (not shown) responsive to position control commands, as is known in the art. Once firmly clamped, the master controller 25 may command transmission of ultrasonic welding energy via the sonotrode 14 for a calibrated duration, such that the ultrasonic welding energy is passed from the sonotrode 14 directly into the cleaning block 62. This action is intended to remove, via periodic light abrasion by the cleaning block 62, any residual copper or other metal material present on the sonotrode 14.

In a non-limiting embodiment, an optional sacrificial layer 17 may be applied to the welding pads 21 of the sonotrode 14 in-process upon switching from the welding of one type of metal material, e.g., copper, to welding of another metal such as aluminum. Application of the sacrificial layer 17 may be via automated or manual spraying, as described below with reference to FIG. 1A, or alternatively by swabbing, rolling, sponging, stamping, and the like. The use of the sacrificial layer 17 as detailed herein enables a single sonotrode 14 to be used when welding different types of metals. Typically, ultrasonic welding of dissimilar metals requires the use of two different sonotrodes 14 to avoid undesirable tool adhesion. For example, one sonotrode 14 may be used to weld copper work pieces, such as tabs of a battery as shown in FIG. 2, and a different sonotrode 14 may be used to weld all of the aluminum work pieces. The sonotrode 14 used to weld aluminum work pieces in this example, if first used to weld copper work pieces, may have a tendency to adhere to the aluminum work pieces.

As part of the method 100, the welding pads 21 of the sonotrode 14 of FIG. 1 may be treated in-process with the sacrificial layer 17. The specific material chosen for the sacrificial layer 17 depends on the different metals being welded. For example, the work pieces 40 may include an elongated, U-shaped aluminum interconnecting member having a floor 41, copper cell tabs 42, and aluminum cell tabs 44 in an example embodiment. An interconnect board 29 of a battery module is shown to indicate that such cell tabs 42 and 44 are electrode extensions of battery cells housed within a battery housing (not shown). When copper and aluminum are the materials of the work pieces 40, colloidal silica may be used as the sacrificial layer 17. This particular material is effective at reducing the reactivity of residual copper and the aluminum work pieces to a level below a calibrated adhesion threshold. Other materials may be used provided they likewise sufficiently reduce the reactivity of the two metals being used.

The master controller 25 described above commands, e.g., via transmission of control signals (arrows 11) to the welding controller 20 and ultimately to a drive system 12D of the welding assembly 12 over a suitable network path, a movement of the welding assembly 12 to the work pieces 40, with such motion indicated by double-headed arrow B in the upper right of FIG. 1. The sonotrode 14 clamps to the anvil 16 as indicated by double-headed arrow A. In the position illustrated in FIG. 1, the sonotrode 14 is clamped to an applicator 30 at an application station 50. In this position, the welding pads 21 of the sonotrode 14, which are adjacent to the applicator 30, are temporarily and lightly pressed to the applicator 30 in response to the control signals (arrows 11).

The applicator 30 in a possible design may be embodied as a sponge or other absorbent material that is pre-wetted with a predetermined anti-adhesion material 33 in an aqueous form, which ultimately forms the sacrificial layer 17. For instance, a reservoir 32 may be provided that contains the anti-adhesion material 33 in a gel or liquid form. The applicator 30 in this embodiment may be any moisture-retaining structure that can draw the anti-adhesion material 33 from the reservoir 32, such as via suction or by capillary action, to thereby maintain sufficient saturation of the applicator 30 for wetting the welding pads 21. Alternatively, the reservoir 32 may be dispensed with and the applicator 30 can be periodically soaked to a suitable degree with the predetermined anti-adhesion material 33.

Other embodiments may be envisioned, such as a soft composite layer or layers of a dry film of the same or similar anti-adhesion material 33. That is, the application station may include a solid block or matrix coated with the anti-adhesion material 33. The controller 25 can command application of the anti-adhesion material 33 to the welding pads 21 by commanding application of a force to the sonotrode 14 sufficient for bringing the welding pads 21 into contact with such a solid block or matrix.

By way of example, the anti-adhesion material 33 may be first applied to a solid block or a matrix in an aqueous form and then allowed to dry. A block of aluminum with a roughened surface may be used as a base to which to apply the anti-adhesion material 33. The block or matrix could be any material suitable for retaining the sacrificial layer 17 such that the sacrificial layer 17 does not easily flake off with a few uses.

Instead of a solid block or matrix, the predetermined anti-adhesion material 33 could be applied to a porous material such as a metallic or a polymeric open cell foam or a fibrous structured material to the same effect. In any of these embodiments, the application station 50 would be located within range of the sonotrode 14 to allow periodic reapplication of the sacrificial layer 17 to the welding pads 21 or other suitable portions of the welding system 10, or optionally to the work pieces 40.

Figure 1A:
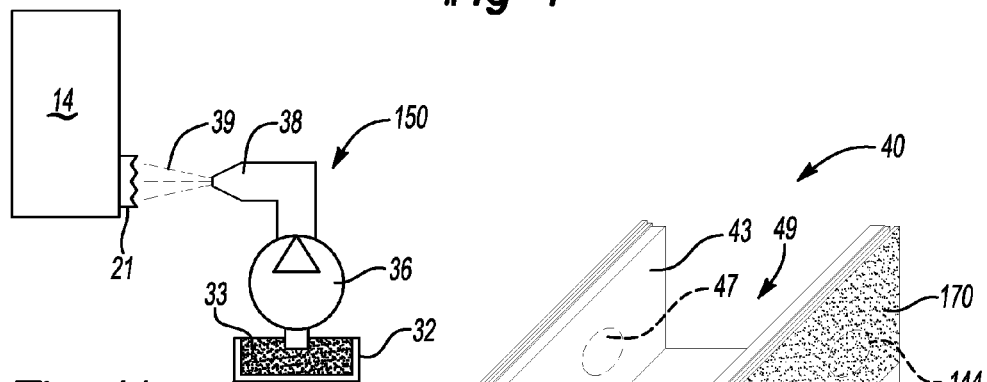
FIG. 1A is a schematic illustration of an optional spray-type application station for use in the vibration welding system shown in FIG. 1.
Figure 2:
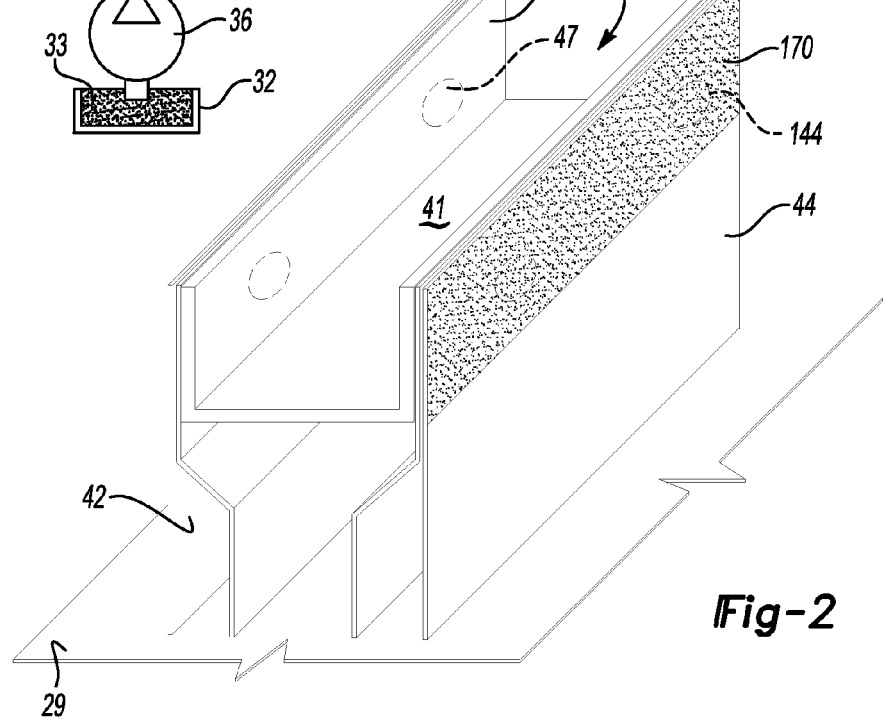
FIG. 2 is a schematic perspective side view of an example battery module having metal tabs and interconnecting members of different materials that may be joined together via the vibration welding system of FIG. 1.

Referring briefly to FIG. 1A, the application station 50 of FIG. 1 may be constructed as an alternative application station 150. In such an embodiment, a small fluid pump 36 may draw the anti-adhesion material 33 from the reservoir 32 and circulate the anti-adhesion material 33 to a spray nozzle 38. Pressure provided by the fluid pump 36 causes the anti-adhesion material 33 to be discharged in a concentrated spray pattern 39 onto the welding pads 21 of the sonotrode 14. The spray nozzle 38 may be configured to emit a fine spray only on the area of the welds so as to minimize overspray.

Referring to FIGS. 1 and 2, in an example embodiment the work pieces 40 may embody part of a multi-cell battery module having cell tabs 42 and 44 of opposite charge. For instance, the cell tabs 44 may be constructed of aluminum and can provide the cathode or positive tabs, while cell tabs 42 of copper can provide the anode or negative tabs. A pair of the cell tabs 42, 44 may be positioned on respective sides of an elongated, U-shaped interconnecting member 49, typically constructed of copper. For illustrative simplicity, only a portion of the example battery module is shown, however the battery module as a whole may include an extended series of interconnecting members 49 arranged side by side in one or more rows, and each having a floor 41 and parallel side walls 43.

Each interconnecting member 49 joins oppositely-charged cell tabs 42, 44 of adjacent battery cells, with the cell tabs 42, 44 forming individual electrode extensions of a given battery cell. Each cell tab 42, 44 is internally-welded, below an interconnect board 29 of the battery module, i.e., a plastic or metal housing of the battery module, to the various anodes or cathodes comprising that particular battery cell, as is well understood by those of ordinary skill in the art.

As the welding assembly 12 of FIG. 1 moves across the work pieces 40, the master controller 25 may command welding of only the copper tabs, i.e., the cell tabs 42, to the interconnecting member 49 to form copper welds 47, for instance two per side wall 43 as shown in FIG. 1. This process may leave residual amounts of copper on the welding pads 21 of the sonotrode 14 as explained above, which in turn can react with the aluminum of the cell tabs 44 when switching to welding of aluminum welds 144. Application of the sacrificial layer 17 to the welding pads 21 upon transitioning from welding of the copper welds 47 is therefore intended to reduce severity of any adhesion of the sonotrode 14 to the work pieces 40 in the area of the aluminum welds 144. While an optional additional sacrificial layer 170 may be applied directly to the cell tabs 44 as shown in FIG. 2, coating of the welding pads 21 is sufficient for reducing reactivity. The additional sacrificial layer 170 could be used in some embodiments without also providing the welding pads 21 with the sacrificial layer 17.

By way of example, after welding a series of copper welds 47, around 35 μg of residual copper may remain on a given welding pad 21 that has not been provided with the sacrificial layer 17 described above. This may be reduced by at least 50% via a thin coating of the anti-adhesion material 33, whether such material is allowed to dry or remains wet at the time of welding. Reductions of residual copper to about 16 μg correlate to low instances of adhesion, again using the copper-aluminum example. Application of the sacrificial layer 17 may occur at a transition to the dissimilar metal, e.g., a transition from copper welding to aluminum welding, as opposed to with each weld of an aluminum cell tab 44, for process efficiency. An example method 100 will now be described with reference to FIG. 3.

The method 100 according to an example embodiment commences with step 102, wherein the master controller 25 of FIG. 1 commands movement of the sonotrode 14 to the work pieces 40 to commence a vibration welding process. The method 100 then proceeds to step 104.

At step 104, the master controller 25 commands welding of a set of workpieces (WP1) of a first metal, e.g., copper, via the control signals (arrow 11). The method 100 proceeds to step 106 with each completed weld of the first type of metal, where the master controller 25 determines if more cell tabs of the same metal type remain to be welded. For instance, if a work piece 40 is used in the form of a battery module having sixteen interconnecting members 49, the master controller 25 determines if all of the interconnecting members 49 have been welded to cell tabs constructed of the same type of metal.

Alternatively, the welding system 10 may include the sensor 35 shown in FIG. 1, i.e., a position sensor that measures a position of the sonotrode 14 and transmits the measured position to the master controller 25 as the position signal (arrow $P_{14}$). In such an embodiment, the master controller 25 may be programmed to compare the value of the position signal (arrow $P_{14}$) to a known last weld position of the battery module to which the work pieces 40 belong to detect a transition from welding work pieces 40 of the first metal, here copper, to welding work pieces of a second metal, e.g., aluminum, where once again the second metal is different from and reactive with the first metal. Steps 104 and 106 are repeated until all of the work pieces 40 of the same first metal are welded, and then proceeds to optional step 108.

Step 108 entails moving the sonotrode 14 to the application station 50, e.g., via transmission of the control signals (arrow 11) to the drive system 12D. Once properly positioned at the application station 50, a condition which may be determined by sensing the position of the welding assembly 12 and controlling the position via closed-loop controls as is well known in the art, the method 100 proceeds to step 110.

Optional step 110 entails applying the anti-adhesion material 33 to the welding pads 21. Step 110 in various embodiments may include commanding a pressing of the sonotrode 14 against a pre-wetted applicator 30, as explained above, or spraying the anti-adhesion material 33 directly onto the welding pads 21 as shown in FIG. 1A. Alternatively, the anti-adhesion material 33 may be replaced with a solid layer, such as thin sheets of the same type of material attached to a foam block, or a powder coating entrapped in a fiber mesh network, to the same effect. Once the welding pads 21 have been coated or otherwise provided with the anti-adhesion material 33 used to form the sacrificial layer 17, the controller 25 may increment a counter. The method 100 then proceeds to step 112.

At step 112, the sonotrode 14 welds the workpieces (WP2) of a second material, e.g., aluminum. The second metal is different from the first metal of step 104, with the first metal being reactive to some extent with the second metal. Step 112 continues until all of the work pieces 40 of the second metal are welded to the interconnecting member 49, at which point the method 100 proceeds to step 113.

Optional step 113 entails determining whether the welding pads 21 have been coated with the anti-adhesion material 33 a calibrated number of times (N=CAL). For instance, the master controller 25 may increment a counter (N) with each application as noted above in step 110. If the value of N exceeds a calibrated integer count, the method 100 proceeds to step 114. Otherwise, the method 100 repeats at step 102.

At step 114, the master controller 25 periodically commands movement of the sonotrode 14 to the cleaning station 60 of FIG. 1, e.g., once every calibrated number of welding cycles. The method 100 proceeds to step 116 once the sonotrode 14 is properly positioned at the cleaning station 60. As with steps 102 and 108, step 114 may entail closed-loop position control of the welding assembly 12 by the controller 25 to a known target location of the cleaning station.

At step 116, the controller 25 executes a cleaning control action (EXEC CA) to remove residual material of the work pieces 40 welded at step 104, e.g., copper. Step 116 may include pressing the welding pads 21 to the cleaning block 62 and causing the sonotrode 14 to vibrate at a calibrated ultrasonic or other suitable cleaning frequency. This in turn dislodges the residue from the welding pads 21 without abrading the welding pads 21. As the sonotrode 14 as a whole is typically constructed of a hard tool-grade steel, the materials of the cleaning block 62 should be relatively soft, and thus non-abrasive with respect to the welding pads 21. As noted above, aluminum is one possible material for constructing the cleaning block 62. A porous polyethylene silica or a porous polyethylene alumina composite may be laminated onto an aluminum bar to form the layer 63 shown in FIG. 1, with layer 63 used to dislodge residue from the welding pads 21. As shown in FIG. 1, layer 63 may be present on both sides of the cleaning block 62. This allows the welding pads 21 and 23 to be simultaneously cleaned as needed. As the metals used in the work piece 40 may be different, so may the materials used to construct the layers 63, i.e., with the materials selected according to the particular metal being used. The method 100 proceeds to step 102 once step 116 has continued for a sufficient duration.

Figure 3:
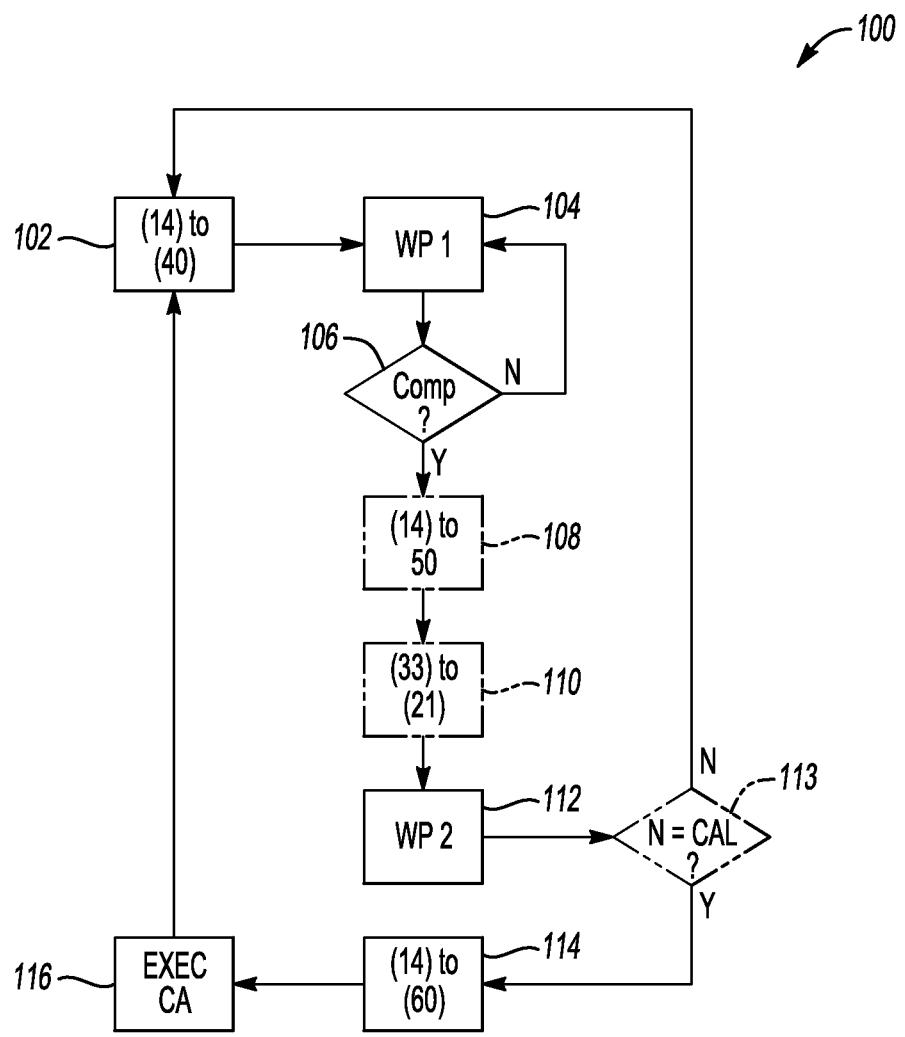
FIG. 3 is a flow chart describing an example method for forming a weld via the vibration welding system shown in FIG. 1.

Accordingly, the welding system 10 of FIG. 1 and the method 100 of FIG. 3 are intended to reduce instances and/or severity of surface adhesion of the sonotrode 14 to the workpieces 40, specifically via reduction of the reactivity of a residual metal such as copper with another metal such as aluminum. In welding of battery cells of different materials, the method 100 allows a single sonotrode 14 to be used for all welds, as opposed to the relatively time consuming process of replacing the sonotrode 14 upon completion of the copper welds. The method 100 may also reduce the scrap rate of any ultrasonic welding process while optimizing process efficiency.

While the best modes for carrying out the disclosure have been described in detail, those familiar with the art to which this disclosure relates will recognize various alternative designs and embodiments that fall within the scope of the appended claims.

The invention claimed is:
1. A welding system comprising:
a sonotrode having a plurality of welding pads;

a cleaning block; and a controller in communication with the sonotrode, and programmed to periodically command clamping of the sonotrode onto the cleaning block and transmission of ultrasonic energy from the clamped sonotrode into the cleaning block for a calibrated duration sufficient for removing residual amounts of a predetermined metal from a surface of the welding pads.

2. The welding system of claim 1, wherein the controller is programmed to periodically command clamping of the sonotrode onto the cleaning block after a calibrated number of welding cycles.

3. The welding system of claim 1, wherein the cleaning block includes an aluminum bar and a polymeric material forming a coating on the aluminum bar.

4. The welding system of claim 3, wherein the polymeric material is porous polyethylene silica or porous polyethylene alumina, and is laminated onto the aluminum bar.

5. The welding system of claim 1, further comprising an application station operable for applying a sacrificial layer of an anti-adhesion material, wherein the controller is programmed to:

detect a transition from welding a metal work piece of a first metal to welding a metal work piece of a second metal, wherein the second metal is different from and reactive with the first metal;

command movement of the sonotrode to the application station upon detection of the transition;

command application of the anti-adhesion material to the welding pads as the sacrificial layer;

command movement of the sonotrode from the application station to the second metal work piece; and command vibration of the sonotrode at a calibrated frequency for a duration that is sufficient for forming a weld on the work piece of the second metal.

6. The welding system of claim 5, wherein the anti-adhesion material includes colloidal silica.

7. The welding system of claim 5, wherein the application station includes a sponge that is saturated with the anti-adhesion material, and wherein the controller applies the anti-adhesion material to the welding pads by commanding application of a force to the sonotrode that is sufficient for bringing the welding pads into contact with the sponge.

8. The welding system of claim 5, wherein the application station includes a spray nozzle in fluid communication with a fluid pump, and wherein the controller applies the anti-adhesion material to the welding pads by commanding circulation of the anti-adhesion material to the spray nozzle via the fluid pump.

9. The welding system of claim 5, wherein the application station includes a solid block or matrix coated with the anti-adhesion material, and wherein the controller applies the anti-adhesion material to the welding pads by commanding application of a force to the sonotrode that is sufficient for bringing the welding pads into contact with the solid block or matrix.

10. The welding system of claim 5, wherein the first metal is copper and the second metal is aluminum.

11. A method for reducing tool adhesion in an ultrasonic welding system having a sonotrode with a plurality of welding pads, a cleaning block, and a controller, the method comprising:

determining, via the controller, completion of a threshold number of welding cycles;

commanding a clamping of the sonotrode onto the cleaning block, via the controller, in response to completion of the threshold number of welding cycles; and transmitting ultrasonic energy from the clamped sonotrode into the cleaning block for a calibrated duration sufficient for removing residual amounts of a predetermined metal from the welding pads.

12. The method of claim 11, wherein commanding a clamping of the sonotrode onto the cleaning block includes commanding a clamping of the sonotrode onto an aluminum bar laminated with a polymeric material.

13. The method of claim 11, wherein the polymeric material is porous polyethylene silica or porous polyethylene alumina.

14. The method of claim 11, wherein the welding system includes an application station operable for applying a sacrificial layer of an anti-adhesion material, the method further comprising:

detecting a transition from welding a work piece of a first metal to a work piece of a second metal, wherein the second metal is different from and reactive with the first metal;

commanding movement of the sonotrode to the application station upon detection of the transition;

applying the anti-adhesion material to the welding pads as the sacrificial layer;

commanding movement of the sonotrode from the application station to the second metal work piece; and commanding vibration of the sonotrode at a calibrated frequency for a duration that is sufficient for forming a weld on the work piece of the second metal.

15. The method of claim 14, wherein the anti-adhesion material includes colloidal silica.

16. The method of claim 14, wherein the application station includes a sponge saturated with the anti-adhesion material, and wherein applying the anti-adhesion material includes applying a force to the sonotrode sufficient for bringing the welding pads into contact with the sponge.

17. The method of claim 14, wherein the application station includes a spray nozzle in fluid communication with a fluid pump, and wherein applying the anti-adhesion material includes commanding circulation of the anti-adhesion material to the spray nozzle via the fluid pump.

18. The method of claim 14, wherein the application station includes a solid block or matrix coated with the anti-adhesion material, and wherein the controller applies the anti-adhesion material to the welding pads by commanding application of a force to the sonotrode sufficient for bringing the welding pads into contact with the solid block or matrix.

19. The method of claim 14, wherein the first metal is copper and the second metal is aluminum.

* * * * *